(12) United States Patent
Yang

(10) Patent No.: US 7,599,063 B2
(45) Date of Patent: Oct. 6, 2009

(54) METHOD FOR CHECKING ALIGNMENT ACCURACY USING OVERLAY MARK

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 23 days.

(21) Appl. No.: 11/693,427

(22) Filed: Mar. 29, 2007

(65) Prior Publication Data

US 2008/0242043 A1 Oct. 2, 2008

(51) Int. Cl.
*G01B 11/00* (2006.01)
*G03F 9/00* (2006.01)

(52) U.S. Cl. .......................................... 356/401; 430/22
(58) Field of Classification Search .................. None
See application file for complete search history.

(56) References Cited

U.S. PATENT DOCUMENTS

| | | | |
|---|---|---|---|
| 6,801,313 B1 | 10/2004 | Yokota | |
| 6,809,420 B1* | 10/2004 | Wong | 257/773 |
| 7,136,144 B2* | 11/2006 | Smith et al. | 355/52 |
| 7,190,824 B2* | 3/2007 | Chen | 382/151 |
| 7,196,429 B2* | 3/2007 | Yen et al. | 257/797 |
| 7,474,401 B2* | 1/2009 | Ausschnitt et al. | 356/401 |
| 2005/0193362 A1* | 9/2005 | Phan et al. | 716/19 |

OTHER PUBLICATIONS

Nomoto et al., "Analytical model of the programming characteristics of scaled MONOS memories with a variety of trap densities and a proposal of a trap-density-modulated MONS memory," IEEE, 2001, pp. 13.5.1-13.5.4.*

Article titled "Analytical model of the programming characteristics of scaled MONOS memories with a variety of trap densities and a proposal of a trap-density-modulated MONS memory" jointly authored by Nomoto et al., Sony Corporation Semiconductor Network Company, Kanagawa, Japan, (C) 2001 IEEE. pp. 13.5.1-13.5.4.

* cited by examiner

*Primary Examiner*—Gregory J Toatley, Jr.
*Assistant Examiner*—Gordon J Stock, Jr.
(74) *Attorney, Agent, or Firm*—J.C. Patents

(57) ABSTRACT

A method for checking the alignment accuracy using an overlay mark is provided. The overlay mark includes an inner mark and an outer mark formed on a wafer. The outer mark is formed in a lower layer on the wafer when the lower layer is patterned. The inner mark is formed within the outer mark over the lower layer when a lithography process for defining an upper layer is performed. A measurement process is conducted to obtain a first relation between each of the interior profiles of the outer marks and a second relation between each of the inner marks. Alternatively, a third relation between each of the interior profiles of the outer marks and each of the inner marks is obtained. The X-directional alignment accuracy and y-directional alignment accuracy are computed according to the first and the second relations, or the third relation.

11 Claims, 6 Drawing Sheets

(a)

(b)

(a)

(b)

METHOD FOR CHECKING ALIGNMENT ACCURACY USING OVERLAY MARK

BACKGROUND OF THE INVENTION

1. Field of Invention

The present invention relates to an integrated circuit (IC) fabrication process. More particularly, the present invention relates to a method for checking the alignment accuracy in a photolithograph process for defining an upper layer with respective to a lower layer on a wafer.

2. Description of Related Art

Generally, besides having to control the critical dimension, alignment accuracy (AA) is also an important factor for determining the success of a photolithograph process of a wafer. Accordingly, the measurement of alignment accuracy, in other words, the measurement of overlay accuracy is an important issue in a semiconductor process. Further, the overlay mark is tool for measuring an overlay error, in which the alignment between a pattern of a photoresist layer and a previously formed layer on the wafer after the lithograph process, is determined.

FIG. 1 includes drawing (a) and drawing (b), wherein drawing (b) is a cross-sectional view of drawing (a) along the cutting line I-I. FIG. II also includes drawing (a) and drawing (b), wherein drawing (b) is a cross-sectional view of drawing (a) along the cutting line II-II. Referring to FIG. 1, when the lower layer 102 in the device region of a wafer is patterned, two trenches 122a and 122b in the Y-direction and two trenches 124a, 124b in the X-direction are concurrently formed in the non-device region as an outer mark. After the formation of a subsequent upper layer on the wafer, a photolithograph process is performed to concurrently form a photoresist pattern in the device region and two bar-shape photoresist patterns 132a and 132b along the Y direction and two bar-shape photoresist patterns 134a and 134b along the X direction in the non-device region as an inner mark of an overlay mark.

Conventionally, the method of using the overlay mark for measuring the alignment accuracy includes measuring the interior profiles and the exterior profiles, respectively, of the Y-directional trenches 122a and 122b to obtain the center lines $S_{122a}$ and $S_{122b}$. Further, the center lines $S_{132a}$ and $S_{132b}$ of the Y-directional photoresist patterns 132a and 132b are obtained. Thereafter, the distance dy1 between the center lines $S_{122a}$ and $S_{132a}$ and the distance dy2 between the center lines $S_{122b}$ and $S_{132b}$ are calculated. If dy1 is equal to dy2, the overlay error in the y direction is 0. The same method is used to determine the overlay error in the X direction. If the overlay errors is both the X direction and the Y direction are not within the acceptable range of deviations, the photoresist layer is removed and the photolithograph process is repeated until the overlay errors are lower than the acceptable range of deviations.

However, during the fabrication of the trenches 122a, 122b, 124a, 124b as the overlay marks, the varying positions of the trenches or other factors in the fabrication process may induce unbalance stresses to the lower layer on the wafer. Ultimately, the profiles of two corresponding trenches become asymmetrical, resulting with the X-directional trenches 124a and 124b or the Y-directional trenches 122a and 122b tilted asymmetrically or their dimensions being different as shown in FIG. 2. In FIG. 2, the size of the Y-directional trench 122b' is greater than the size of the Y-directional trench 122a'. If the conventional alignment accuracy method is applied for calculating the overlay error, the resulting center lines of the Y-directional trenches 122a'/122b' are shifted to the positions respectively depicted as $S_{122a'}$ and $S_{122b'}$. Consequently, the differences between the distances dy1' and dy2', which are the distances between the center lines $S_{122a'}$ and $S_{122b'}$ of the trenches 122a/122b and the center lines $S_{132a}/S_{132b}$ of the neighboring photoresist pattern, are not the actual overly error in the Y direction. Ultimately, an overlay shift is resulted. The overlay shift in the X direction and the overlay shift in the Y direction adversely affect the overlay accuracy. More particularly, even dy1 and dy2 are equal, the overlay error is not necessary 0. Similarly, even dx1 and dx2 are equal, the overlay error in the X-direction is not necessary 0. Hence, the conventional method is unreliable for determining alignment accuracy between the photoresist pattern and the wafer.

SUMMARY OF THE INVENTION

In view of the foregoing, the present invention provides a method for using an overly mark for checking the alignment accuracy, in which a more preferable inspection result of alignment accuracy is provided.

The present invention provides a method for checking alignment accuracy, wherein the method is applicable for checking the alignment accuracy in a photolithograph process for defining an upper layer with respect to a lower layer on the wafer. The method includes forming a plurality of overlay marks. The steps of forming the overlay marks of the invention include forming a plurality of outer marks in certain parts of the lower layer during the patterning of the lower layer. Each outer mark further includes an exterior profile and an interior profile. Thereafter, during the photolithograph process, an inner mark is formed within each outer mark above the lower layer. Each inner mark includes an exterior profile and an interior profile. A measurement process is then performed to obtain the relations, for example, the spatial relations, between the interior profiles of the outer marks and the relations between the neighboring inner marks, or the relations between the interior profile of each of the outer marks and each of the neighboring inner marks. Thereafter, these relations are used to calculate the X-directional alignment and the Y-directional alignment between a lower layer on the wafer and an upper pattern layer in a lithography process.

According to an embodiment the above mentioned method of the invention for checking alignment accuracy, the distance between the interior profile of each neighboring outer mark and the center line of each neighboring inner mark.

According to an embodiment of the above-mentioned method for checking the alignment accuracy of the invention, the outer marks are formed by forming 2 X-directional trenches and two Y-directional trenches in the lower layer on the wafer.

According to an embodiment of the above-mentioned method of the invention for checking the alignment accuracy, the method of forming the inner marks includes patterning a photoresist layer used in the photolithography process to form two X-directional bars and two Y-directional bars.

According to an embodiment of the above-mentioned method of the invention for checking alignment accuracy, the distances dx1 and dx2 between the center lines of the interior profiles of the two X-directional trenches and the two corresponding X-directional bars, and the distances dy1 and dy2 between the center lines of the interior profiles of the two Y-directional trenches and the two corresponding Y-directional bars are obtained during the measurement process.

According to an embodiment of the above-mentioned method of the invention for checking alignment accuracy, when dx1=dx2 and dy1=dy2, the lower layer on the wafer is completely aligned with the upper pattern layer for the photolithograph process.

According to an embodiment of the above-mentioned method of the invention for checking alignment accuracy, the distance between the interior profile of each outer mark and the interior profile of each neighboring inner mark is obtained in the measurement process. Further the distance is used to calculate the X-directional alignment and the Y-directional alignment in a photolithography process with respect to the lower layer on the wafer.

According to an embodiment of the above-mentioned method of the invention for checking alignment accuracy, the distance between the interior profile of each outer mark and the exterior profile of each neighboring outer mark is obtained in the measurement process. Further the distance is used to calculate the X-directional alignment and the Y-directional alignment in a photolithography process with respect to the lower layer on the wafer.

According to an embodiment of the above-mentioned method of the invention for checking alignment accuracy, the relation between center line between the interior profiles of the outer marks and the center line between the center lines of the neighboring inner marks is obtained in the measurement process.

According to an embodiment of the above-mentioned method of the invention for checking alignment accuracy, the relation between center line between the interior profiles of the outer marks and the center line between the exterior profiles of the neighboring inner marks is obtained from the measurement process.

According to an embodiment of the above-mentioned method of the invention for checking alignment accuracy, the relation between the center line between the interior profiles of the outer marks and the center line between the interior profiles of the neighboring inner marks is obtained in the measurement process.

Using the above method for checking the alignment of the overlay marks, the profiles and the dimensions of the alignment marks being asymmetrical can be obviated. More particularly, the error in overlay measurement accuracy resulting from a profile deformity of the exterior profile of the outer mark is mitigated. Ultimately, the results from checking alignment accuracy are desirable.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
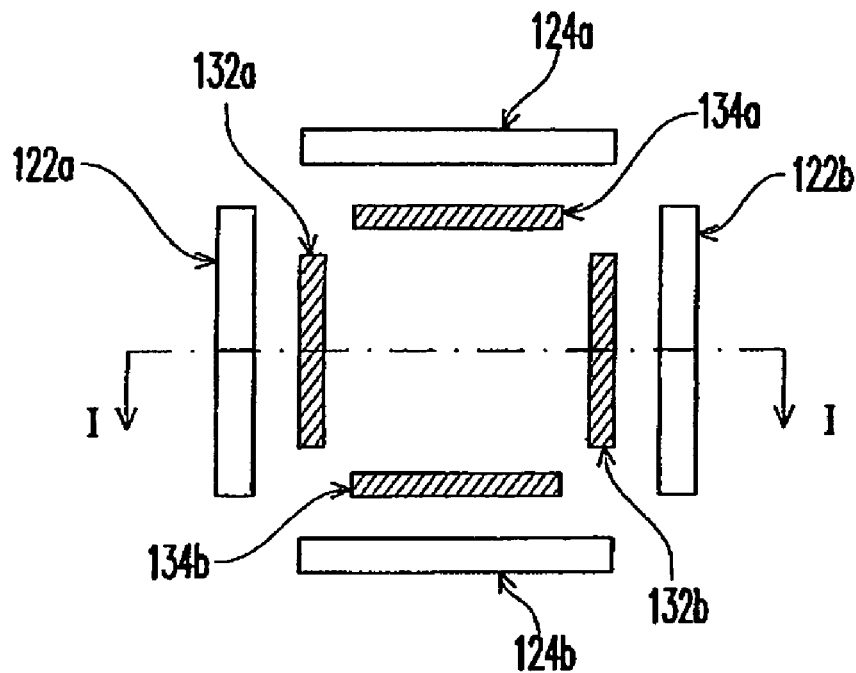
FIG. 1 is a schematic diagram illustrating one type of overlay mark and an application thereof according to the prior art.
Figure 1:
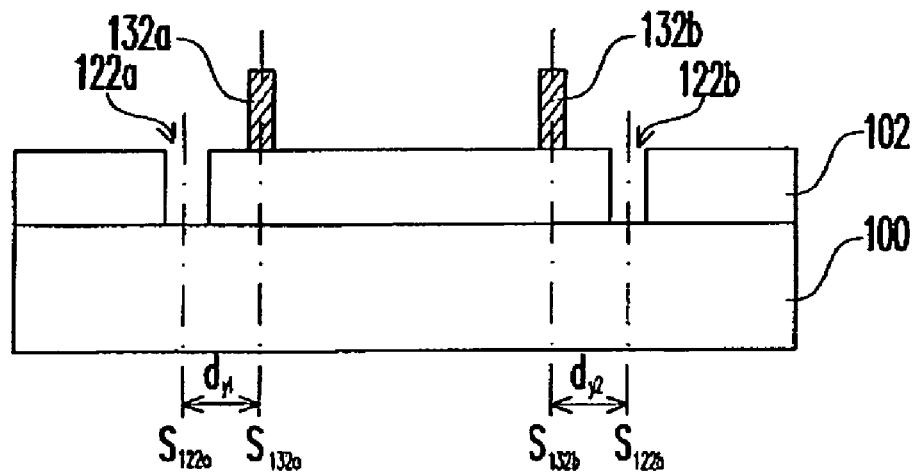
Figure 2:
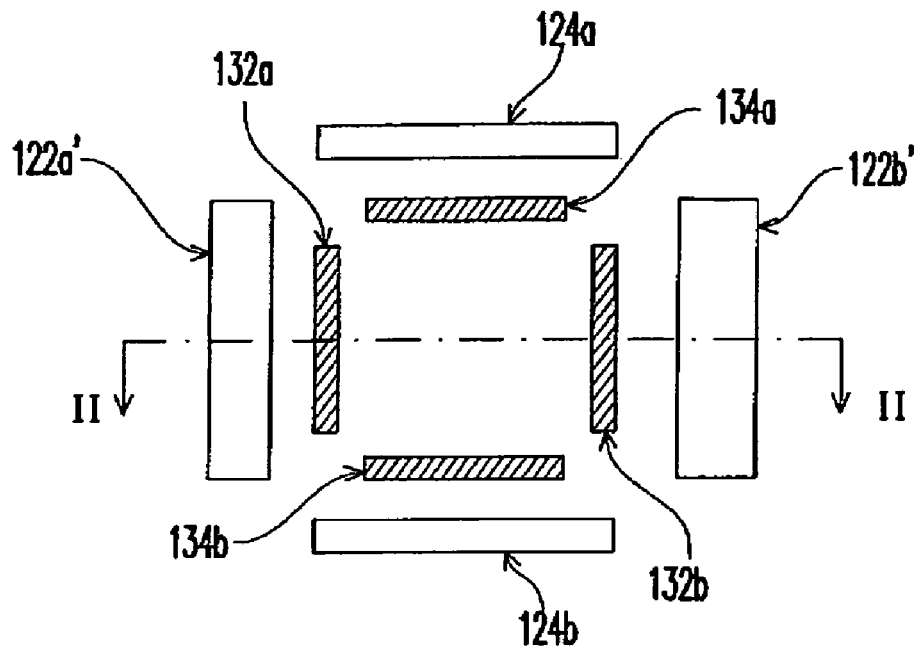
FIG. 2 is schematic diagram illustrating another type of overlay mark and an application thereof according to the prior art.
Figure 2:
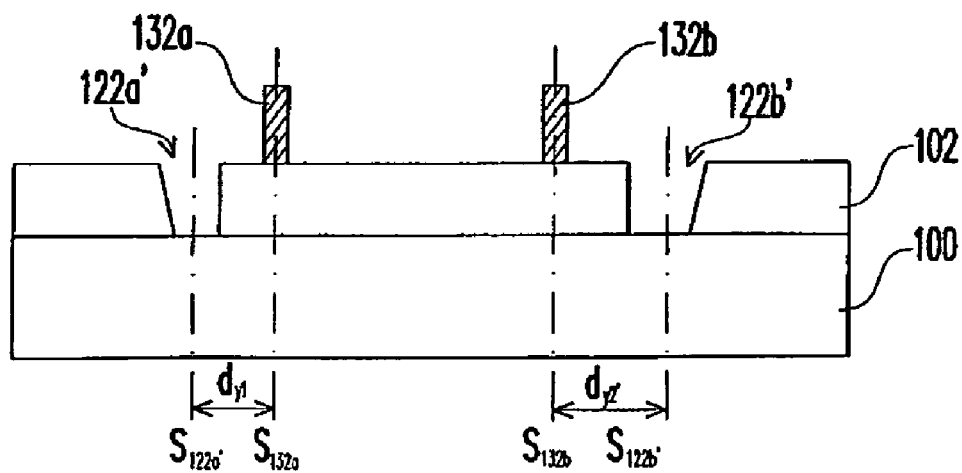
Figure 3:
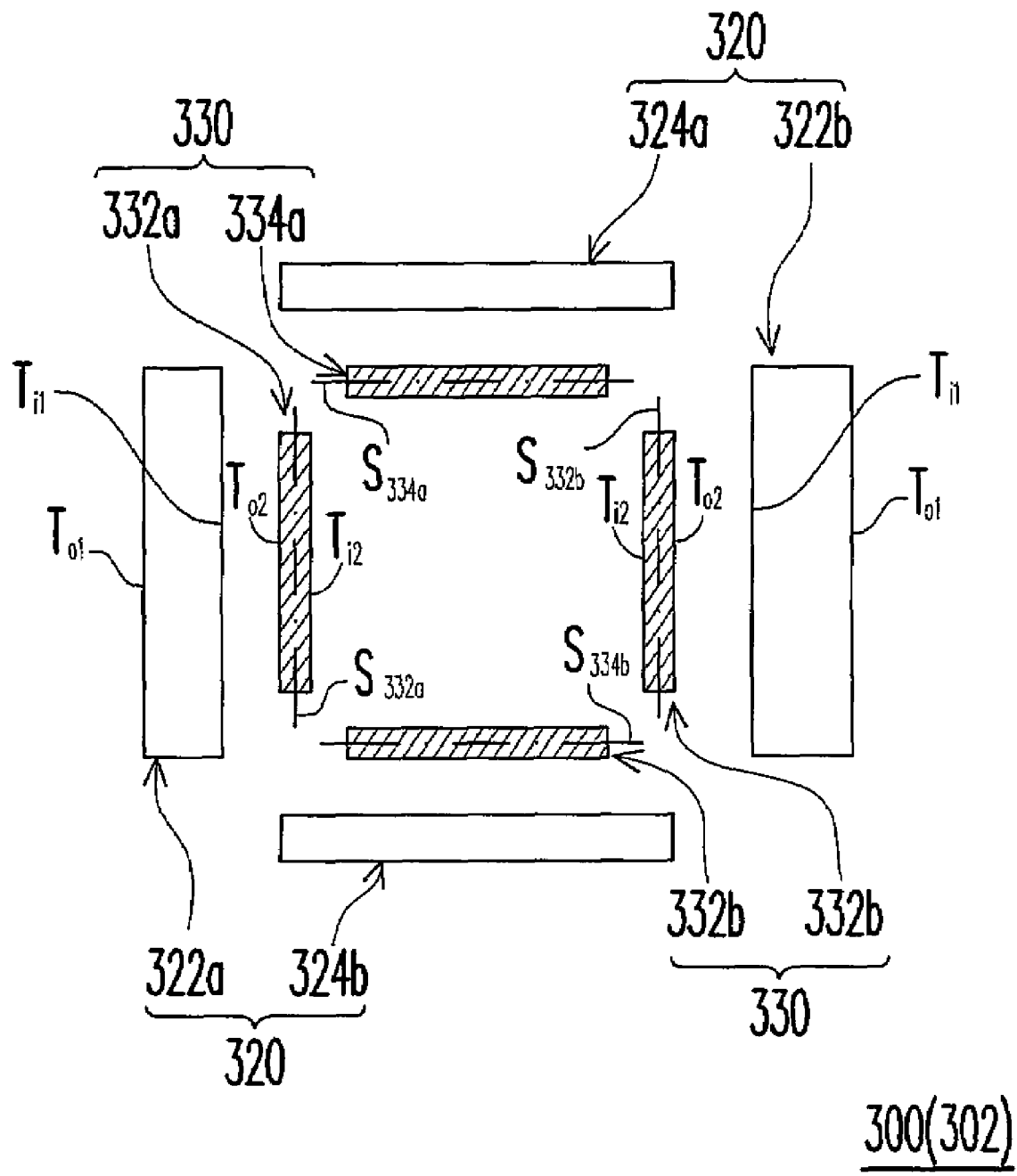
FIG. 3 is a schematic diagram illustrating one type of overlay mark according to an embodiment of the invention.
Figure 4:
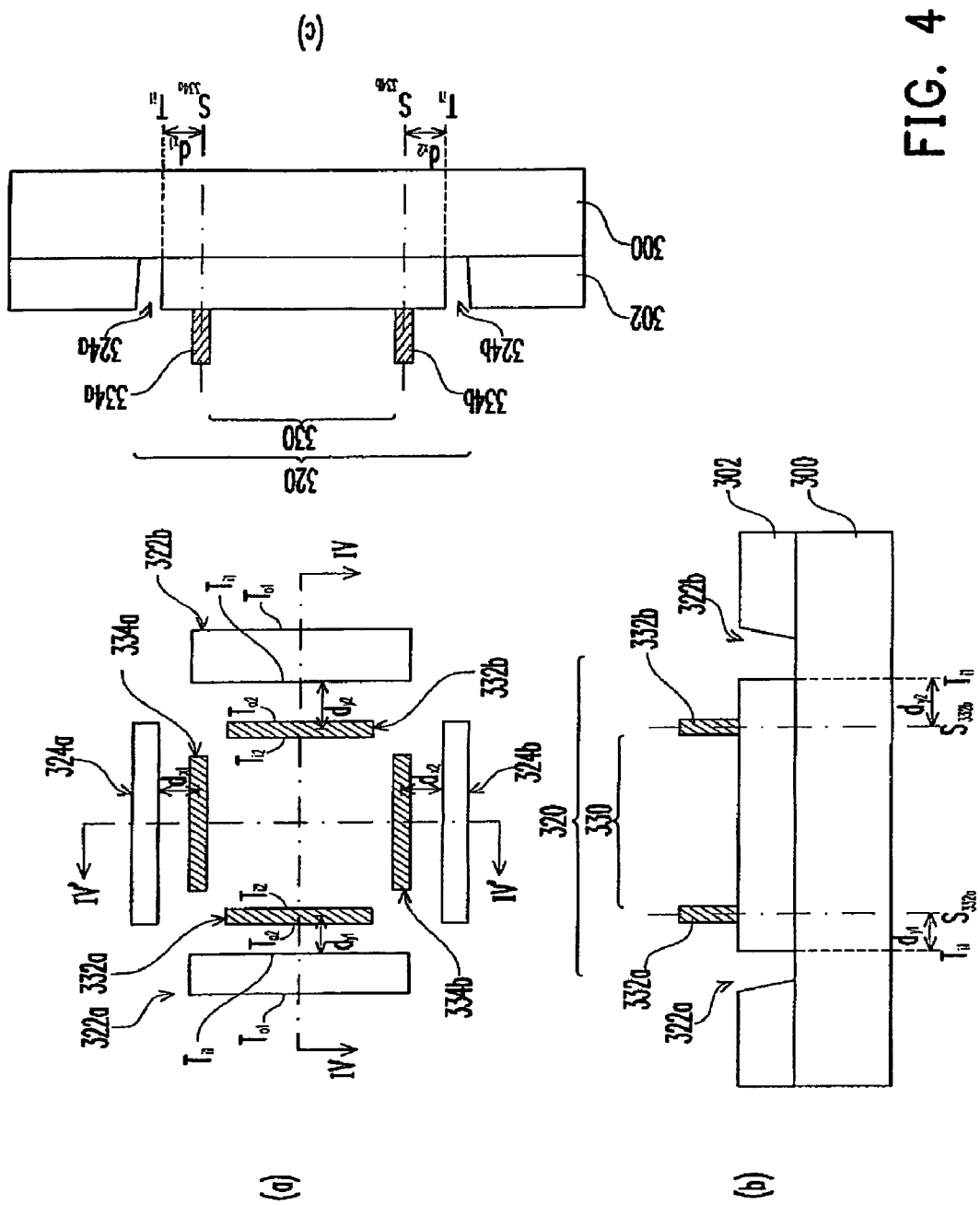
FIG. 4 is a schematic diagram illustrating one type of overlay mark and an application thereof according to an embodiment of the invention.
Figure 5:
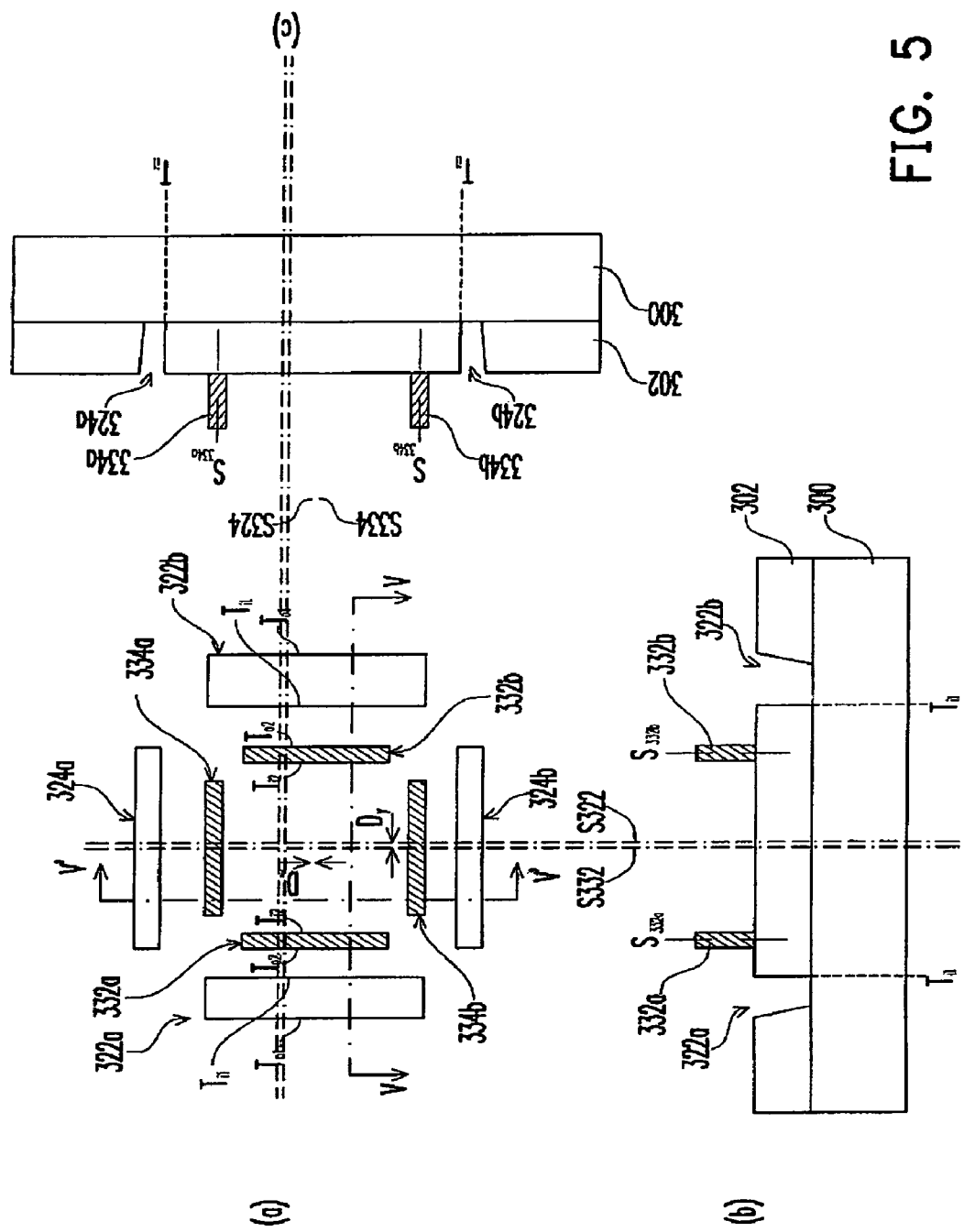
FIG. 5 is a schematic diagram illustrating one type of overlay mark and an application thereof according to an embodiment of the invention.

FIGS. 3, 4, and 5 are schematic diagrams respectively illustrating the overlay mark of the present invention and an application thereof. FIG. 4 includes drawing (a), drawing (b) and drawing (c), wherein drawing (a) is a top view of the overlay mark, and drawing (b) and drawing (c) are cross-sectional views of drawing (a) along the cutting lines IV-IV and IV'-IV', respectively. FIG. 5 includes drawing (a), drawing (b) and drawing (c), wherein drawing (a) is a top view of the overlay mark, and drawing (b) and drawing (c) are cross-sectional views of drawing (a) along the cutting lines V-V and V'-V', respectively. In this exemplary embodiment, the overlay mark includes, for example, two X-directional, orthogonal trenches and two Y-directional, orthogonal trenches as the outer mark, and two X-directional bars and two Y-directional bars as the inner mark. However, it is appreciated that the shapes and the configurations of the overlay mark introduced herein may be embodied in many different forms and should not be construed as limited to the embodiments set forth herein.

Referring to FIG. 3, as the lower layer 302 in the device region of a wafer 300 is being patterned, an outer mark 320 is concurrently formed in the non-device region. The outer mark 320 may constitute with, but not limited to, two Y-directional wenches 322$a$, 322$b$ and two X-directional trenches 324$a$, 324$b$. Each trench also includes an exterior profile $T_{o1}$ and an interior profile $T_{i1}$. The lower layer 302 is a dielectric layer, for example. The non-device region is a scribe line region, for example. During the etching of the trenches 322$a$, 322$b$, 324$a$ and 324$b$, the various positions of these trenches or other factors in the fabrication process may induce unbalance stresses to the lower layer on the wafer, causing the profiles of two corresponding trenches asymmetrically formed. Ultimately, the X-directional trenches 324$a$, 324$b$ or the Y-directional trenches 322$a$, 322$b$ may tilt asymmetrically or their sizes are different. As shown in FIG. 3, the size of the Y-directional trench 322$b$ is greater than that of the Y-directional trench 322$a$.

Thereafter, an upper layer (not shown) is formed over the wafer 300. The upper wafer layer includes but not limited to a metal layer. After forming the upper layer (not shown), a photoresist pattern of the device region and the inner mark 330 of the overlay mark are concurrently formed in a photolithograph process. The inner mark 330 is configured within the outer mark 320. The inner mark 330 includes but not limited to two Y-directional bar-shape photoresist patterns 332$a$, 332$b$ and two X-directional bar-shape photoresist patterns 334$a$, 334$b$.

Still referring to FIG. 3, the method for measuring alignment accuracy using the overlay mark according to an embodiment of the invention includes using the interior profile $T_{i1}$ of the outer mark 320 as the bench mark for calculating alignment accuracy, and not using the relation between the interior profile $T_{i1}$ and the exterior profile $T_{o1}$ of the outer mark 320 as a bench mark for calculating alignment accuracy. In one embodiment, the method of the invention includes measuring the relation, for example, the spatial relation between the interior profile $T_{i1}$ of each outer mark 320 and the neighboring inner mark 330. For example, the distance between the interior profile $T_{i1}$ of the outer mark 320 and the center line $S_{332a}$, $S_{332b}$ of the neighboring inner mark 330 is measured or the distance between the interior profile $T_{i1}$ of the outer mark 320 and the interior profile $T_{i2}$ of the neighboring inner mark 330 or the distance between the interior profile $T_{i1}$ of the outer mark 320 and the exterior profile $T_{o2}$ of the neighboring inner mark 330, etc.

In another embodiment, the relations between these interior profiles $T_{i1}$ of the outer marks 320 are measured and the relations between the neighboring inner marks 330 are measured. For example, the spatial relation of the center line between two interior profiles $T_{i1}$ of the corresponding outer marks 320 and the center line S between the center lines of the two corresponding neighboring inner marks 330 are measured; or the spatial relation between the center line between two corresponding interior profiles $T_{i1}$ of the outer marks 320 and center line between the interior profiles $T_{i2}$ of two corresponding neighboring inner marks 330 is measured; or the spatial relation between the center line between the interior profiles $T_i$ of the corresponding outer marks 320 and the center line between the exterior profiles $T_{o2}$ of the two corresponding neighboring inner marks 330.

Thereafter, these measurements of spatial relations are used to calculate the alignment for a photolithograph process with respect to the lower wafer level.

Continuing to FIG. 4, in an embodiment of which a bar-in-bar type of mark is used, the distance between the interior profile Ti of each outer mark 320 and the center line of each neighboring inner mark 330 is measured. In this embodiment, the distance $d_{y1}$ between the interior profile $T_{i1}$ of the Y-directional trench 322a and the center line $S_{332a}$ of the corresponding Y-directional bar 322a is measured; the distance $d_{y2}$ between the interior profile $T_{i1}$ of the Y-directional trench 322b and the center line S332b of the corresponding Y-directional bar 322b is measured; the distance $d_{x1}$ between the interior profile $T_{i1}$ of the X-directional trench 324a and the center line $S_{334a}$ of the corresponding X-directional bar 334a is measured; and the distance $d_{x2}$ between the interior profile $T_{i1}$ of the X-directional trench 324b and the center line $S_{334b}$ of the corresponding X-directional bar 334b is measured.

Thereafter, the distances dy1, dy2 and dx1 and dx2 are used to calculate the X-directional alignment and the Y-directional alignment for a photolithograph process with respect to the lower layer on the wafer. If dy1=dy2, the overlay error in the Y direction is 0. If dx1=dx2, the overlay error in the X direction is 0. If dx1=dx2 and dy1=dy2 for all the overlay marks, the lower layer is completely aligned with an upper pattern layer, for example, a photoresist pattern, for the photolithograph process.

When the lower layer on the wafer is completely aligned with the photoresist pattern for the photolithograph process, or the X-directional overlay error and the Y-directional overlay error are within a prescribed range of deviations, the next process step may proceed. If the overlay errors in the X-direction and in the Y-direction are greater than the acceptable range of deviations, the required alignment between the photoresist pattern and the wafer has not achieved. Hence, the photoresist layer is removed and the photolithography process is repeated until the overlay error is within the acceptable range of deviations.

In the above embodiment, the measuring of the distance between the interior profile $T_{i1}$ of an outer mark 320 and the center line S of the neighboring inner mark 330 is used to illustrate the technique of the invention. In an actual application, the distance between the interior profile $T_{i1}$ of the outer mark 320 and the interior profile $T_{i2}$ of the neighboring inner mark 330, or the distance between the interior profile $T_{i1}$ of the inner mark 320 and the exterior profile $T_{o2}$ of the neighboring inner mark 320 can be measured for calculating alignment.

Referring to FIG. 5, in another embodiment, the center line between two interior profiles $T_{i1}$ of the corresponding outer marks 320 and the center line between the neighboring inner marks 330 are respectively measured. The overlay error is calculated based on the positions of the two center lines. In this embodiment, the center line $S_{322}$ between the interior profile $T_{i1}$ of the Y-directional trench 322a and the interior profiles $T_{i1}$ of the Y-directional trench 322b is measured; the center line $S_{332}$ between the center line $S_{332a}$ of the Y-directional bar 332a and the center line $S_{332b}$ of the Y-directional bar 332 is measured; the center line $S_{334}$ between the interior profile $T_{i1}$ of the X-directional trench 324a and the interior profile $T_{i1}$ of the X-directional trench 324b is measured; and the center line $S_{334}$ between the center line $S_{334a}$ of the X-directional bar 334a and the center line $S_{334b}$ of the X-directional bar 334b is measured.

Thereafter, the distance Dy between the Y-directional center lines $S_{332}$ and $S_{332}$ and the distance Dx between the X-directional center lines $S_{324}$ and $S_{334}$ are measured for calculating the Y-directional alignment and the X-directional alignment in the photolithography process with respect to the lower layer on the wafer. If Dy is 0, the overlay error in the Y-direction is 0. If Dx is 0, the overlay error in the X-direction is 0. If the Dx and Dy of each overly mark on the wafer is 0, the lower layer on the wafer is completely aligned with the upper pattern layer in the photolithograph process.

When the lower layer on the wafer is completely aligned with the upper pattern layer in the photolithograph process or the overlay errors in the X-direction and in the Y-direction are within the prescribed range of deviations, a next process step may proceed. If the overlay errors in the X-direction and in the Y-direction are greater than the prescribed range of deviations, the alignment between the photoresist pattern and the wafer has not achieved. In such a case, the photoresist layer must be removed and the photolithography process must be repeated until the overlay errors are within the acceptable range of deviations.

In the above embodiment, the spatial relation between the center line of two corresponding interior profiles $T_{i1}$ of the outer marks and the center line of the center lines of two corresponding neighboring inner marks is measured for illustrating the technique of the invention. However, in an actual application, the relation between the center line between two corresponding interior profiles $T_i$ of the outer marks 320 and the center line $T_{i2}$ between the interior profiles of two corresponding neighboring inner marks 330, or the relation between the center line between the interior profiles $T_i$ of corresponding outer marks 320 and the center line between the exterior profiles $T_{o2}$ of two corresponding neighboring inner marks 330 may be measured for calculating alignment.

In the above two embodiments, the interior profile of the outer mark is used as a basis for calculating alignment by using different mathematical calculation methods. However, it should be appreciated that the application of the technique introduced here is not restricted to mathematical calculation methods and this invention shall not be construed as limited to the embodiments set forth herein.

The invention applies the interior profiles of the various outer marks of the overlay mark for calculating alignment. Not only the profile distortion of the overlay mark generated due to changes of the profile or the dimension of the mark during the fabrication process can be mitigated, the accuracy of overlay measurement can be enhanced.

Figure 6:
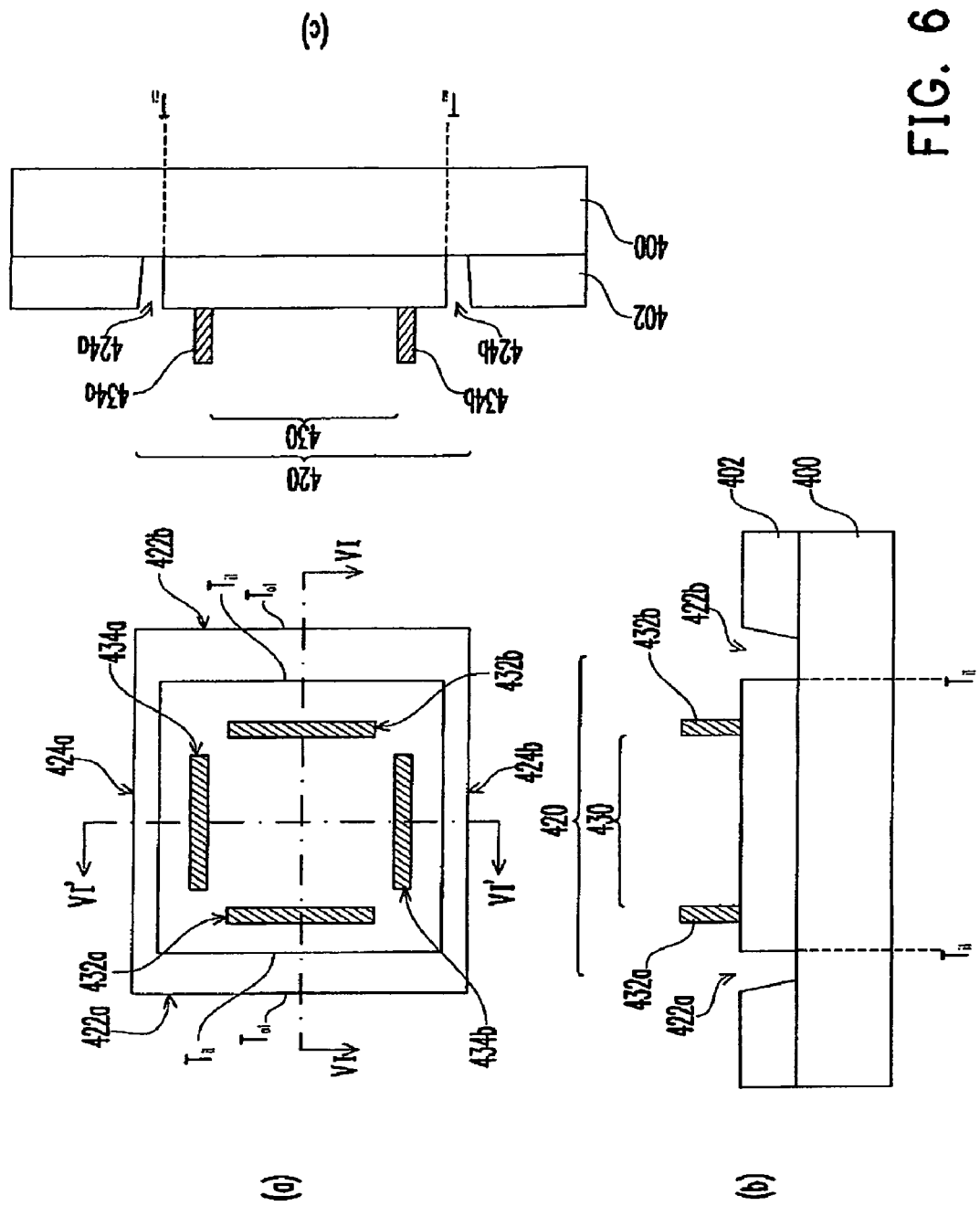
FIG. 6 is a schematic diagram illustrating one type of overlay mark and an application thereof according to an embodiment of the invention.

Further, in the above embodiment, the bar-in-bar type of mark is used to illustrate the present invention. It is to be understood and appreciated that the method described herein may be practiced in conjunction of a bar-in-frame type of overlay mark. FIG. 6 is a schematic diagram illustrating one type of overlay mark and an application thereof according to an embodiment of the invention. FIG. 6 includes drawing (a), drawing (b) and drawing (c), wherein drawing (a) is a top view of the overlay mark, and drawing (b) and drawing (c) are cross-sectional views of drawing (a) along the cutting lines VI-VI and VI'-VI', respectively. Referring to FIG. 6, the overlay mark includes a frame-shape trench as the outer mark 420, and two X-directional bars 434a and 434b and two Y-directional bars 432a and 432b as the inner mark 430. During the patterning of the lower wafer layer 402 in the device region of a wafer 400, an outer mark 420 is concurrently formed in the non-device region. The outer mark 420 is, for example, a frame-shape trench constitute with two Y-directional trenches 422a and 422b and two X-directional trenches 424a and 424b. The frame shaped trench includes one exterior profile $T_{o1}$ and an interior profile $T_{i1}$. The lower layer 402 is a dielectric layer, for example. The non-device region is a scribe line region, for example. During the etching of the trenches 422a, 422b, 424a and 424b, the various positions of these trenches or other factors in the fabrication process may induce unbalance stresses to the lower layer on the wafer, causing the profiles of two corresponding trenches asymmetrically formed. Ultimately, the X-directional trenches 424a, 424b or the Y-directional trenches 422a, 422b may tilt asymmetrically or their sizes are different. As shown in FIG. 6, the size of the Y-directional trench 422b is greater than that of the Y-directional trench 422a, for example.

Thereafter, an upper layer (not shown) is formed over the wafer 400. The upper layer includes but not limited to a metal layer. After forming the upper layer (not shown), a photoresist pattern of the device region and the inner mark 430 of the overlay mark are concurrently formed in a photolithograph process. The inner mark 430 is configured within the outer mark 420. The inner mark 430 includes but not limited to two Y-directional bar-shape photoresist patterns 432a, 422b and two X-directional bar-shape photoresist patterns 434a, 434b.

According to the method for measuring alignment accuracy using the overlay mark of this embodiment of the invention includes using the interior profile $T_{i1}$ of the outer mark 420 as the bench mark for calculating alignment accuracy, instead of using the relation between the interior profile $T_{i1}$ and the exterior profile $T_{o1}$ of the outer mark 420 as a bench mark for calculating alignment accuracy. The method of calculating the alignment accuracy is similar to the method described above; a detail description thereof is omitted herein.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for checking alignment accuracy, which is applicable for checking the alignment accuracy in a photolithography process for defining an upper layer on a wafer with respect to a lower layer on the wafer, the method comprising:

forming a plurality of overlay marks, comprising:

forming a plurality of outer marks in the lower layer on the wafer when the lower layer on the wafer is defined, wherein each outer mark of the plurality of the outer marks comprises an interior profile and an exterior profile;

forming a plurality of inner marks above the lower layer surrounded by the plurality of the outer marks during the photolithograph process, wherein each inner mark of the plurality of the inner marks comprises an interior profile and an exterior profile, and each inner mark of the plurality of the inner marks is formed correspondingly above each outer mark of the plurality of the outer marks, and the interior profile of the each outer mark of the plurality of the outer marks is a sidewall of the each outer mark of the plurality of the outer marks that is the closest to the each inner mark of the plurality of the inner marks formed correspondingly above the each outer mark of the plurality of the outer marks;

performing a measurement process to obtain a first relation between only the interior profile of the each outer mark of the plurality of the outer marks and only the interior profile of another outer mark of the plurality of the outer marks and a second relation between the each correspondingly above inner mark of the plurality of the inner marks and another correspondingly above inner mark of the plurality of the inner marks or to obtain a third relation between only the interior profile of the each outer mark of the plurality of the outer marks and the each correspondingly above inner mark of the plurality of the inner marks; and calculating a X-directional alignment and a Y-directional alignment for the photolithography process with respect to the lower layer using the first and the second relations or the third relation.

2. The method of claim 1, wherein the measurement process comprises obtaining a distance between the interior profile of the each outer mark of the plurality of the outer marks and the interior profile of the each inner mark of the plurality of the inner marks and using the distance for computing an X-directional alignment and a Y-directional alignment for the photolithography process with respect to the lower layer on the wafer.

3. The method of claim 1, wherein the measurement process comprises obtaining a distance between the interior profile of the each outer mark and the exterior profile of the each correspondingly above inner mark of the plurality of the inner marks and using the distance for computing an X-directional alignment and a Y-directional alignment for the photolithography process with respect to the lower layer on the wafer.

4. The method of claim 1, wherein the measurement process comprises obtaining a fourth relation between a first center line between the interior profile of the each outer mark of the plurality of the outer marks and the interior profile of the another outer mark of the plurality of the outer marks and a center lines between a second center line of the each correspondingly above interior mark of the plurality of the interior marks and a third center line of the another correspondingly above inner mark of the plurality of the inner marks.

5. The method of claim 1, wherein the measurement process comprises obtaining an additional relation between a first center line between the interior profile of the each outer mark of the plurality of the outer marks and a center line between the exterior profile of the correspondingly above inner mark of the plurality of the inner marks and the another correspondingly above inner mark of the plurality of the inner marks.

6. The method of claim 1, wherein the measurement process comprises obtaining an additional relation between a first center line between the interior profile of the each outer mark of the plurality of the outer marks and a center line between the interior profile of the correspondingly above inner mark of the plurality of the inner marks and the another correspondingly above inner mark of the plurality of the inner marks.

7. The method of claim 1, wherein the measurement process comprises obtaining a distance between the interior profile of the each outer mark of the plurality of the outer marks and a center line of the each correspondingly above inner mark of the plurality of the inner marks, wherein the distance is used for calculating an X-directional alignment and a Y-directional alignment between the upper layer and the lower layer in the photolithography process.

8. The method of claim 7, wherein each outer mark of the plurality of the outer marks is formed by forming two X-directional trenches and two Y-directional trenches in the lower layer on the wafer.

9. The method of claim 8, wherein each inner mark of the plurality of the inner marks is formed by patterning a photoresist layer used in the photolithograph process to form two X-directional bars and two Y-directional bars.

10. The method of claim 9, wherein the measurement process comprises obtaining distances dx1 and dx2 between the interior profiles of the two X-directional trenches and the center lines of the two correspondingly above X-directional bars and obtaining distances dy1 and dy2 between the interior profiles of the Y-directional trenches and the center lines of the two correspondingly above Y-directional bars.

11. The method of claim 10, wherein when dx1=dx2 and dy1=dy2, the photolithograph process is completely aligned with respect the lower layer.

* * * * *